United States Patent
Morita et al.

[11] Patent Number: 5,936,885
[45] Date of Patent: Aug. 10, 1999

[54] SEMICONDUCTOR MEMORY CAPABLE OF PREVENTING ERRONEOUS INVERSION OF DATA READ FROM MEMORY TRANSISTORS

[75] Inventors: Tsuyoshi Morita; Kazuya Sugita; Akira Hamakawa, all of Tokyo, Japan

[73] Assignee: Mitsubishi Denki Kabushiki Kaisha, Tokyo, Japan

[21] Appl. No.: 09/160,052

[22] Filed: Sep. 25, 1998

[30] Foreign Application Priority Data

Feb. 23, 1998 [JP] Japan ................................. 10-040831

[51] Int. Cl.⁶ ........................... G11C 16/04; G11C 29/00
[52] U.S. Cl. ............................... 365/185.09; 365/185.11; 365/185.2
[58] Field of Search .................... 365/185.09, 185.11, 365/185.2

[56] References Cited

U.S. PATENT DOCUMENTS 5,671,180 9/1997 Higuchi ............................... 365/185.21

FOREIGN PATENT DOCUMENTS 56-71898 6/1981 Japan .
3-134897 6/1991 Japan .

*Primary Examiner*—Andrew Q. Tran
*Attorney, Agent, or Firm*—Burns, Doane, Swecker & Mathis, LLP

[57] ABSTRACT

A semiconductor memory including read memory cells, and detection memory cells, and being able to prevent an erroneous data inversion due to the time-varying reduction in the electric charge injected into their floating gate electrodes. The data in the read memory cells are read through read sense amplifiers, and the data in the detection memory cells are read by one or more detection sense amplifiers. The detection sense amplifiers are more likely to invert the data read out of the detection memory cells than the read sense amplifiers invert the data read out of the read memory cells. This enables the semiconductor memory to detect a sign of the data inversion through the outputs of the detection sense amplifiers before the data inversion of the desired data read from the read memory cells actually takes place, thereby preventing the data inversion of the desired data.

19 Claims, 15 Drawing Sheets

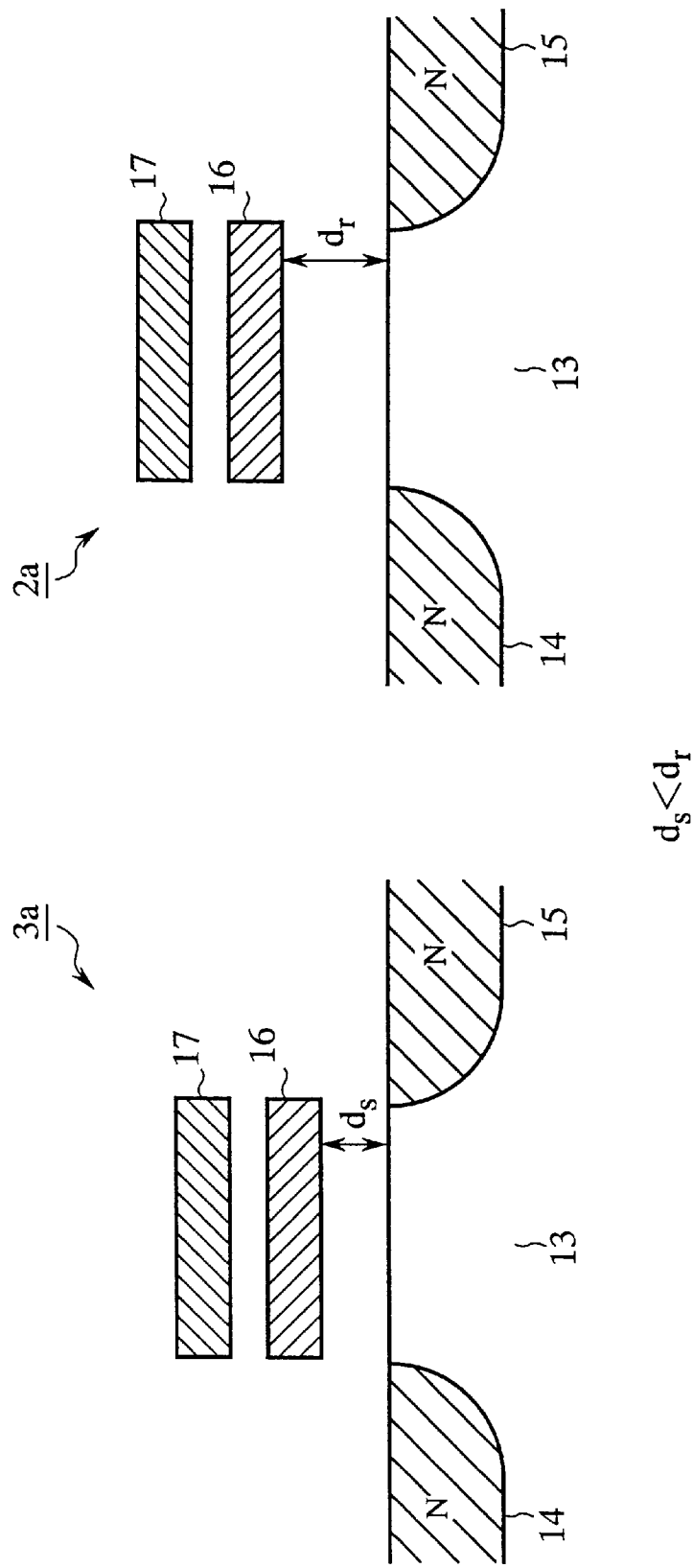

SEMICONDUCTOR MEMORY CAPABLE OF PREVENTING ERRONEOUS INVERSION OF DATA READ FROM MEMORY TRANSISTORS

BACKGROUND OF THE INVENTION

1. Field of the Invention

The present invention relates to an non-volatile semiconductor memory such as a flash memory that rewrites memory information of its memory cells by injecting electric charge into their floating gates, and more particularly to an improvement for preventing so-called threshold reduction in memory transistors, a phenomenon that data read from the memory cells can be inverted because of the time-varying reduction in electric charge injected into the floating gates.

2. Description of Related Art

FIG. 18 is a block diagram showing a part of an internal configuration of a common conventional flash memory disclosed, for example, in Japanese patent application laid-open No. 56-71898/1981. In FIG. 18, the reference numeral 1 designates a memory cell area including an array of a plurality of memory cells; and reference numerals 2s each designate a read memory bank composed of a plurality of memory cells (read memory cells) formed in the memory cell area 1. Reference numerals 4s each designate a read bit-line selector connected to one of the read memory banks 2 for selecting one of the bit lines connected with the read memory cells in the read memory bank 2 in accordance with a first part of the address data AD which is input when the data read access takes place to the flash memory; and 6s each designate a read sense amplifier connected to one of the read bit-line selectors 4 for comparing the voltage level of the bit line selected by the read bit-line selector 4 with a predetermined read threshold voltage, and for outputting read data RD of a voltage level determined by the relationship between these compared voltages. The reference numeral 8 designates a word-line decoder that receives, when data read access takes place to the flash memory, a second part of the address data AD which remains after the first part of the address data is supplied to the read bit-line selector 4, and selects, in response to the second part of the address data AD, one of a plurality of word lines connected to the memory cell area 1.

Next, the operation of the conventional flash memory will be described.

The flash memory with such floating gate electrodes injects electric charge into the floating gate electrode of each read memory cell in order to set the threshold voltage of the read memory cell. Generally, since the threshold voltage for turning on the transistor of the memory cell increases with the injection of the electric charge into the floating gate electrode, no current flows in this case even when the read sense amplifier 6 is connected to the memory cell, and hence the voltage level of a read signal becomes high. On the contrary, since the threshold voltage for turning on the transistor of the memory cell is low unless the electric charge is injected into the floating gate electrode, a current flows when the read sense amplifier 6 is connected to the memory cell, and hence the voltage level of the read signal becomes low. Then, the read sense amplifier 6 compares the voltage level of the read signal with its threshold voltage VTH which is represented by a solid line in FIG. 19, and outputs "0" when the level of the read signal is higher than the threshold voltage VTH, whereas it outputs "1" when it is lower than the threshold voltage VTH. In FIG. 19, the horizontal axis represents a voltage Vcc supplied to the flash memory, and the vertical axis represents the voltage levels of the threshold and read signal.

Since the conventional semiconductor memory with the floating gate electrodes is thus arranged, a phenomenon can occur that the electric charge injected into the floating gate electrode of each read memory cell leaks after a certain time period, and hence the voltage level of the read signal drops below the threshold voltage VTH of the read sense amplifier 6 as shown in FIG. 19, so that the read data RD of the read memory cell which originally stores "0" is inverted to "1".

In view of this, manufactures of such semiconductor memories try to prevent the problem of the threshold reduction in the memory transistors of the conventional semiconductor memories by shipping only semiconductor memories that meet specified characteristics in their examinations. Such a countermeasure against the threshold reduction in the memory transistors of the semiconductor memories can only experientially reduce a possibility of its occurrence in the field they are actually used, and limits their yield, as well.

SUMMARY OF THE INVENTION

The present invention is implemented to solve the foregoing problem. It is therefore an object of the present invention to provide a semiconductor memory which can positively prevent the threshold reduction in its memory transistors, and improve its yield.

According to a first aspect of the present invention, there is provided a semiconductor memory comprising: a plurality of read memory cells, each of which includes a floating gate electrode and outputs a read signal with a voltage level corresponding to an amount of electric charge injected into its floating gate electrode; one or more of detection memory cells formed on a semiconductor substrate on which the read memory cells are formed, each of the detection memory cells having a floating gate electrode and outputting a detection signal with a voltage level corresponding to an amount of electric charge injected into its floating gate electrode; one or more read sense amplifiers, each of which makes a decision of the voltage level of the read signal by comparing it with a first threshold voltage, and outputs its result as read data; and one or more detection sense amplifiers, each of which makes a decision of the voltage level of the detection signal by comparing it with a second threshold voltage, and outputs its result as detection data, wherein at least one of a group of the detection memory cells and a group of the detection sense amplifiers is formed to induce erroneous data inversion of the detection data earlier than that of the read data in a time-varying process of the electric charge in the floating gate electrodes.

Here, the detection memory elements may be disposed separately in a memory cell area of the read memory cells.

The first threshold voltage and the second threshold voltage may be set such that a voltage difference between the second threshold voltage and the voltage level of the detection signal is smaller than a voltage difference between the first threshold voltage and the voltage level of the read signal.

The detection memory cells may be formed to leak the electric charge in their floating gate electrodes more easily than the read memory cells.

A distance between the semiconductor substrate and the floating gate electrodes in the detection memory cells may be shorter than that in the read memory cells.

Each of the read memory cells may comprise an N-type source diffusion region, and a lightly doped N-type source diffusion region formed on a periphery of the N-type source diffusion region.

The read memory cells may have a coating formed thereon.

The semiconductor memory may further comprise a control circuit for enabling the detection sense amplifiers to output the detection data of the detection memory cells when data access takes place to the semiconductor memory.

The semiconductor memory may further comprise a control circuit for enabling the detection sense amplifiers to output the detection data of the detection memory cells when power is turned on of the semiconductor memory.

The semiconductor memory may further comprise a control circuit for enabling the detection sense amplifiers to output the detection data of the detection memory cells at every fixed interval.

According to a second aspect of the present invention, there is provided a semiconductor memory comprising: a plurality of read memory cells, each of which includes a floating gate electrode and outputs a read signal with a voltage level corresponding to an amount of electric charge injected into its floating gate electrode; one or more detection memory cells formed on a semiconductor substrate on which the read memory cells are formed, each of the detection memory cells having a floating gate electrode and outputting a detection signal with a voltage level corresponding to an amount of electric charge injected into its floating gate electrode; and one or more shared sense amplifiers, each of which makes a decision of the voltage level of the read signal by comparing it with a first threshold voltage to output its result as read data, and makes a decision of the voltage level of the detection signal by comparing it with a second threshold voltage to output its result as detection data, wherein at least one of a group of the detection memory cells and a group of the shared sense amplifiers is formed to induce erroneous data inversion of the detection data earlier than that of the read data in a time-varying process of the electric charge in the floating gate electrodes.

BRIEF DESCRIPTION OF THE DRAWINGS

FIGS. 15A and 15B are cross-sectional views showing a detection memory cell 3a and a read memory cell 2a of an embodiment 6 of the flash memory in accordance with the present invention, respectively;

DETAILED DESCRIPTION OF THE PREFERRED EMBODIMENTS

The invention will now be described with reference to the accompanying drawings.

Embodiment 1

Figure 1:
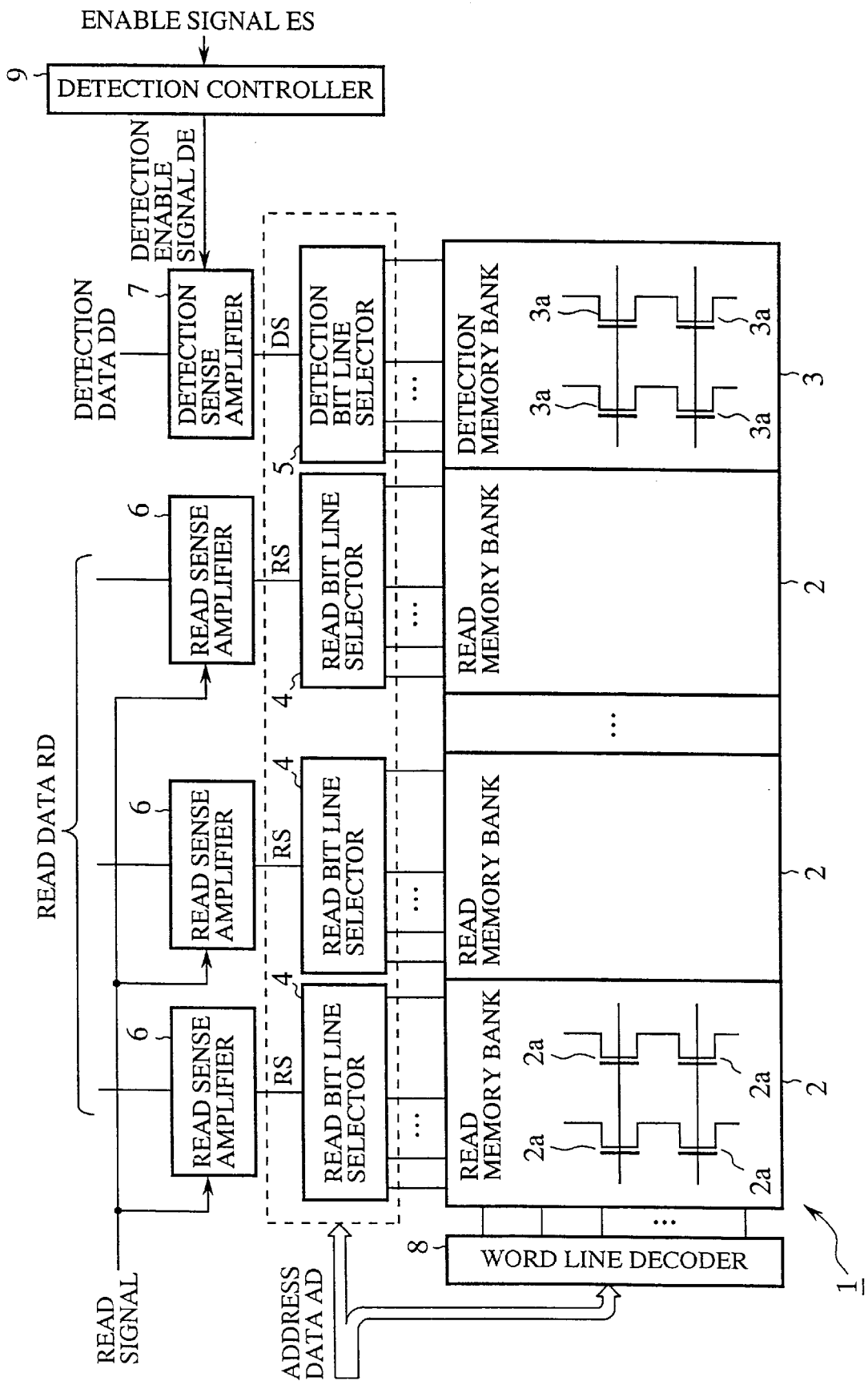
FIG. 1 is a block diagram showing a configuration of a major portion of an embodiment 1 of a flash memory in accordance with the present invention.

FIG. 1 is a block diagram showing a configuration of a major portion of an embodiment 1 of a flash memory in accordance with the present invention. In FIG. 1, the reference numeral 1 designates a memory cell area including an array of a plurality of memory cells; reference numerals 2s each designate a read memory bank composed of a plurality of memory cells (read memory cells) 2a formed in the memory cell area 1; and the reference numeral 3 designates a detection memory bank composed of a plurality of memory cells (detecting memory cells) 3a formed in the memory cell area 1. Reference numerals 4s each designate a read bit-line selector connected to one of the read memory banks 2 for selecting one of the bit lines connected with the read memory cells 2a in the read memory bank 2 in accordance with a first part of the address data AD which is input when the data read access takes place to the flash memory; and 5 designates a detection bit-line selector connected to the detection memory bank 3 for selecting one of the bit lines connected with the detecting memory cells 3a in the detection memory bank 3 in accordance with the first part of the address data AD which is input when the data read access takes place to the flash memory. Reference numerals 6s each designate a read sense amplifier connected to one of the read bit-line selectors 4 for comparing the voltage level of the bit line selected by the read bit-line selector 4 with a predetermined read threshold voltage, and for outputting read data RD with a voltage level determined by the relationship between the compared voltages; and 7 designates a detection sense amplifier connected to the detection bit-line selector 5 for comparing the voltage level of the bit line selected by the detection bit-line selector 5 with a predetermined detecting threshold voltage, and for outputting detection data DD with a voltage level determined by the relationship between the compared voltages. The reference numeral 8 designates a word-line decoder that receives, when data read access takes place to the flash memory, a second part of the address data AD which remains after the first part of the address data AD is supplied to the read bit-line selector 4, and selects, in response to the second part of the address data AD, one of a plurality of word lines connected to the memory cell area 1; and 9 designates a detection controller that receives an enable signal ES when the data read access takes place, and outputs operation control signals to the read sense amplifiers 6 and the detection sense amplifier 7 in response to the enable signal ES.

Figure 2:
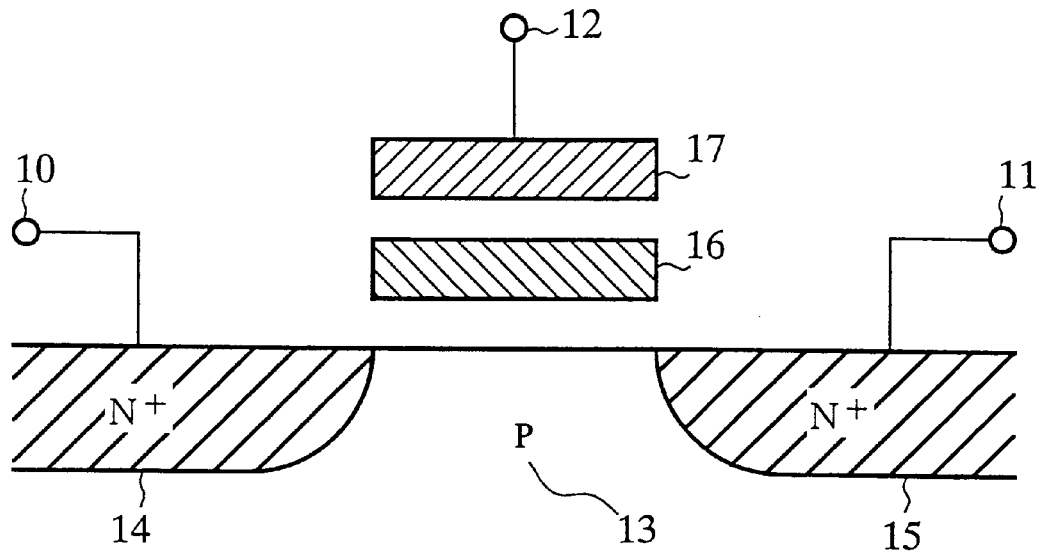
FIG. 2 is a cross-sectional view showing a structure of a memory cell in the embodiment 1.

FIG. 2 is a cross-sectional view showing a structure of the memory cells 2a and 3a in the embodiment 1. In FIG. 2, the reference numeral 10 designates a source terminal connected to a source line; 11 designates a drain terminal connected to the bit line; and 12 designates a gate terminal connected to the word line. The reference numeral 13 designates a P-type semiconductor substrate; 14 designates an N-type source diffusion region formed in the P-type semiconductor substrate 13 and connected to the source terminal 10; and 15 designates an N-type drain diffusion region formed in the P-type semiconductor substrate 13 apart from the N-type source diffusion region 14 and connected to the drain terminal 11. The reference numeral 17 designates a gate electrode opposite to and separated from the P-type semiconductor substrate 13 between the source diffusion region 14 and drain diffusion region 15, and is connected to the gate terminal 12; and 16 designates a floating gate electrode formed between the gate electrode 17 and the P-type semiconductor substrate 13 such that it is separated from them. The memory banks 2 and 3 each includes multiple memory cells 2a and 3a arrayed in a matrix, respectively.

Figure 3:
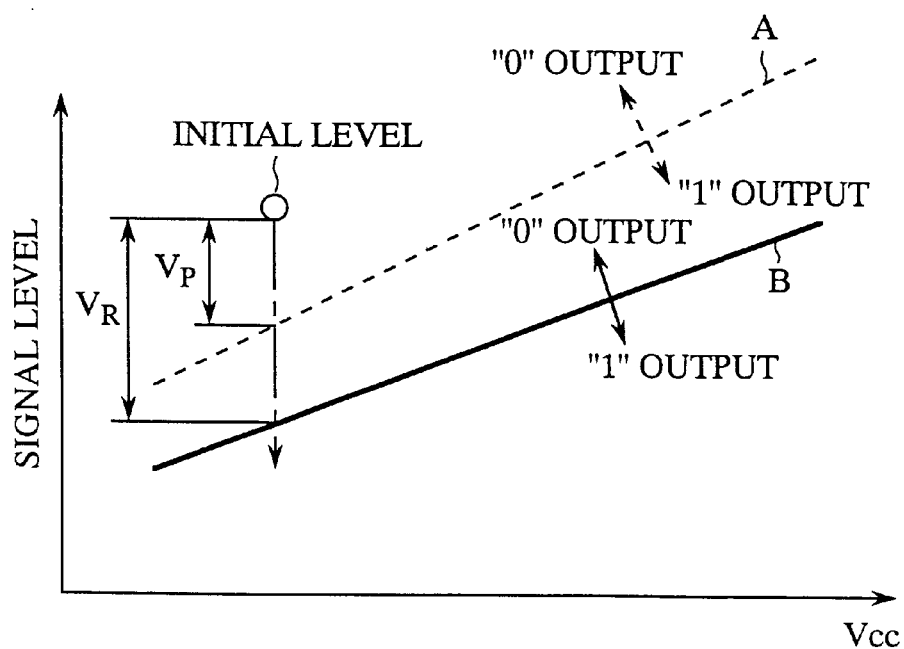
FIG. 3 is a graph illustrating threshold voltage characteristics of two types of sense amplifiers in the embodiment 1.

FIG. 3 is a graph illustrating characteristics of the two types of sense amplifiers 6 and 7 in the embodiment 1. In FIG. 3, the horizontal axis represents EL supply voltage Vcc to the flash memory, and the vertical axis represents the threshold voltage level. The symbol A denotes a threshold voltage characteristic line of the detection sense amplifier 7 and B denotes that of the read sense amplifier 6. As illustrated in FIG. 3, although both the threshold voltages increase with the supply voltage Vcc, the two types of the sense amplifiers 6 and 7 are formed such that the threshold voltage of the detection sense amplifier 7, that is, detecting threshold voltage is always set higher than that of the read sense amplifier 6, that is, the read threshold voltage. The sense amplifiers 6 and 7 produce data (read data RD and detection data DD) of "0" when signals (read signal RS and detection signal DS) are input which are higher than their threshold voltage characteristic lines A and B, respectively, and produce data of "1" when signals are input which are lower than these lines.

Next, the operation of the present embodiment 2 of the flash memory will be described.

Figure 4:
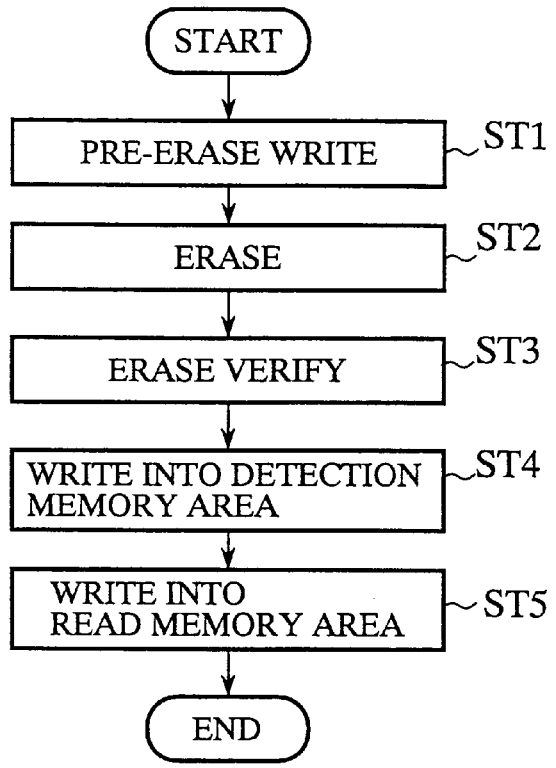
FIG. 4 is a flowchart of a memory write operation in the embodiment 1.

FIG. 4 is a flowchart illustrating a memory write operation in the present embodiment 1. In FIG. 4, ST1 designates a pre-erase write step of injecting electric charge into the floating gate electrodes 16 of the entire memory cells 2a and 3a in the memory cell area 1; ST2 designates an erase step of carrying out erasure by drawing the electric charge from the memory cell area 1 in which the step ST1 has been completed, until the signal voltages of the memory cells 2a and 3a drop below the threshold voltage; ST3 designates an erase verify step of confirming that the entire memory cells 2a and 3a in the memory cell area 1 output the signal voltages lower than the threshold voltage; ST4 designates a detecting memory area write step of injecting electric charge into the floating gate electrodes 16 of the entire memory cells 3a in the detection memory bank 3; and ST5 designates a read memory area write step of injecting electric charge into the floating gate electrodes 16 of the entire memory cells 2a in the read memory bank 2.

Figure 5:
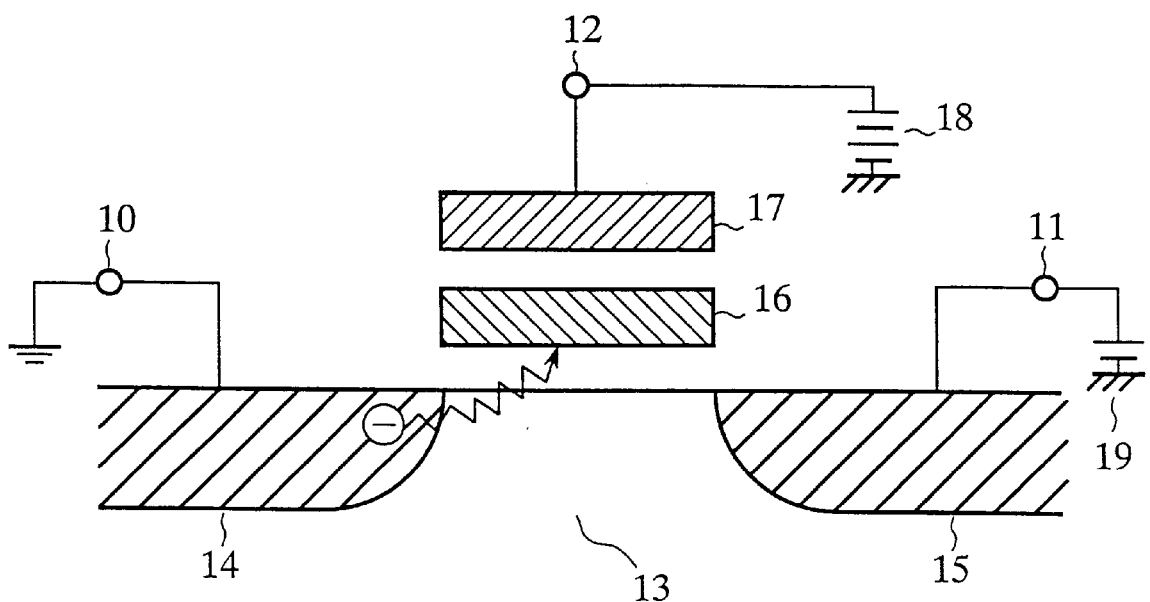
FIG. 5 is a schematic cross-sectional view showing a connection for injecting electric charge into a floating gate electrode in the memory write operation as illustrated in the flowchart of FIG. 4.

FIG. 5 is schematic cross-sectional view illustrating a connection when injecting the electric charge into the floating gate electrode 16 in the memory write operation in the flowchart as shown in FIG. 4. In FIG. 5, the reference numeral 18 designates a first high DC (direct current) voltage source for applying to the gate terminal 12 a positive high voltage, and 19 designates a DC voltage source for applying to the drain terminal 11 a positive voltage lower than the high voltage of the first high DC voltage source 18. In this connection, the source terminal 10 is grounded.

Figure 6:
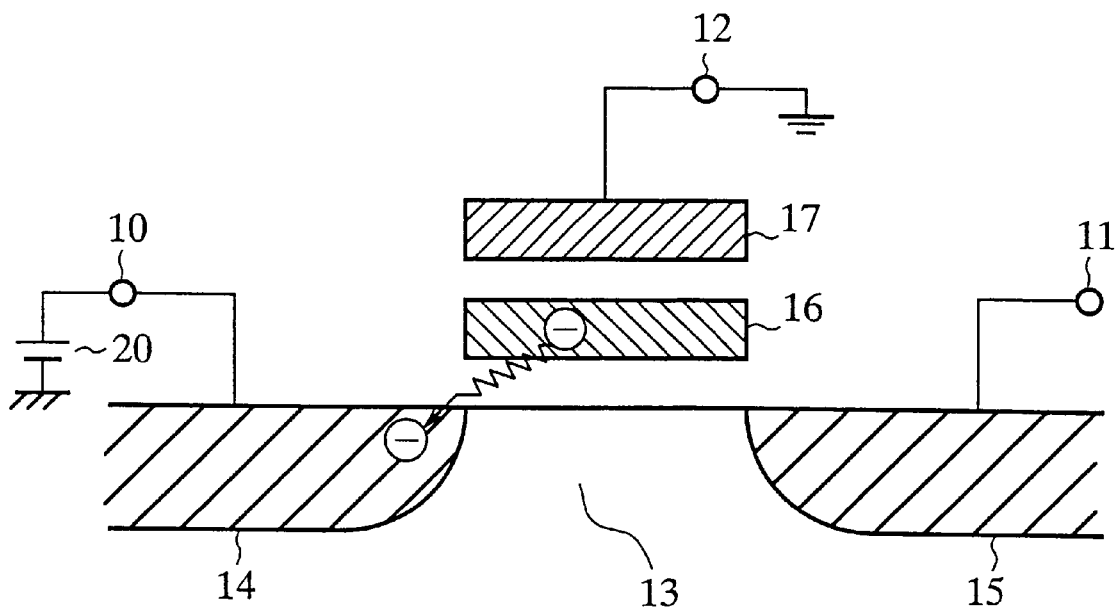
FIG. 6 is a schematic cross-sectional view showing a connection for drawing electric charge out of the floating gate electrode in the memory write operation as illustrated in the flowchart of FIG. 4.

With such a voltage supply arrangement, the high DC voltage is applied across the gate electrode 17 and source diffusion region 14 so that electrons, moving from the source diffusion region 14 to the gate electrode 17, are stored in the floating gate electrode 16 as hot electrons. This will increase the hole density in the portion of the P-type semiconductor substrate 13 opposite to the floating gate electrode 16, and hence, to form the N channel in that portion, a higher gate voltage is required than when the electric charge is not injected into the floating gate electrode 16, FIG. 6 is schematic cross-sectional view illustrating a connection when drawing the electric charge from the floating gate electrode 16 in the memory write operation in the flowchart as shown in FIG. 4. In FIG. 6, the reference numeral 20 designates a second high DC voltage source for applying to the source terminal 10 a positive high voltage. The gate terminal 12 is grounded, and the drain terminal 11 is placed in a floating state.

With such a voltage supply arrangement, a reverse high DC voltage is applied across the source diffusion region 14 and gate electrode 17 so that an electric field is formed for moving the electrons from the gate electrode 17 to the source diffusion region 14. The electric field will cause the electric charge stored in the floating gate electrode 16 to move into the source diffusion region 14.

Next, the data read operation will be described.

Figure 7:
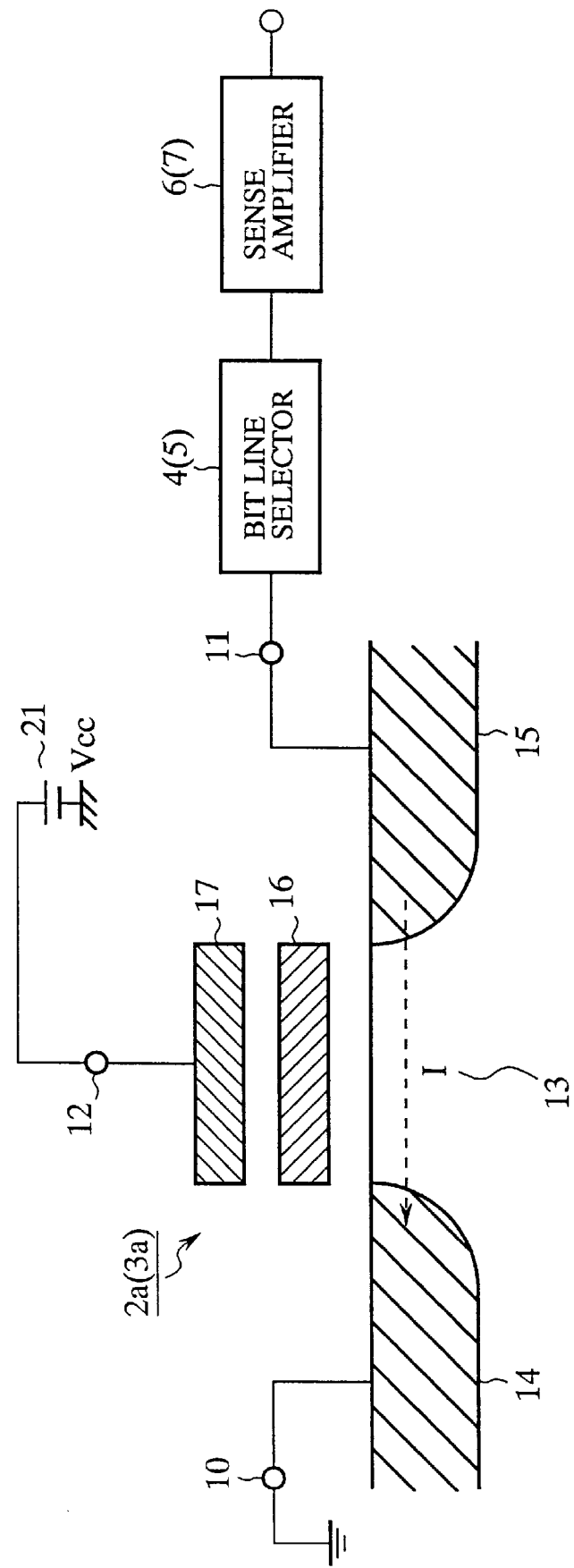
FIG. 7 is a block diagram showing a connection for reading data from a memory cell whose floating gate electrode is not charged in the embodiment 1.

FIG. 7 is a block diagram showing a connection for reading the memory cell 2a (3a) when no electric charge is stored in the floating gate electrode 16. In FIG. 7, the reference numeral 21 designates a voltage source connected to the gate terminal 12. The source terminal 10 is grounded, and the drain terminal 11 is connected to the sense amplifier 6 (7) through the bit-line selector 4 (5). With such a connection, the electron concentration in the portion in the P-type semiconductor substrate 13 opposite to the gate electrode 17 increases owing to the voltage supply to the gate electrode 17, so that a conduction state (channel) is formed between the source diffusion region 14 and drain diffusion region 15. Thus, when the sense amplifier 6 (7) connects a read current source to the drain terminal 11 (bit line) to read data, a current flows from the drain terminal 11 to the source terminal 10, thereby producing a signal of a low voltage level from the drain terminal 11. The sense amplifier 6 (7) compares the voltage level of the signal with the predetermined threshold voltage, and outputs data of "1" as shown in FIG. 3 because it is lower than the threshold voltage.

Figure 8:
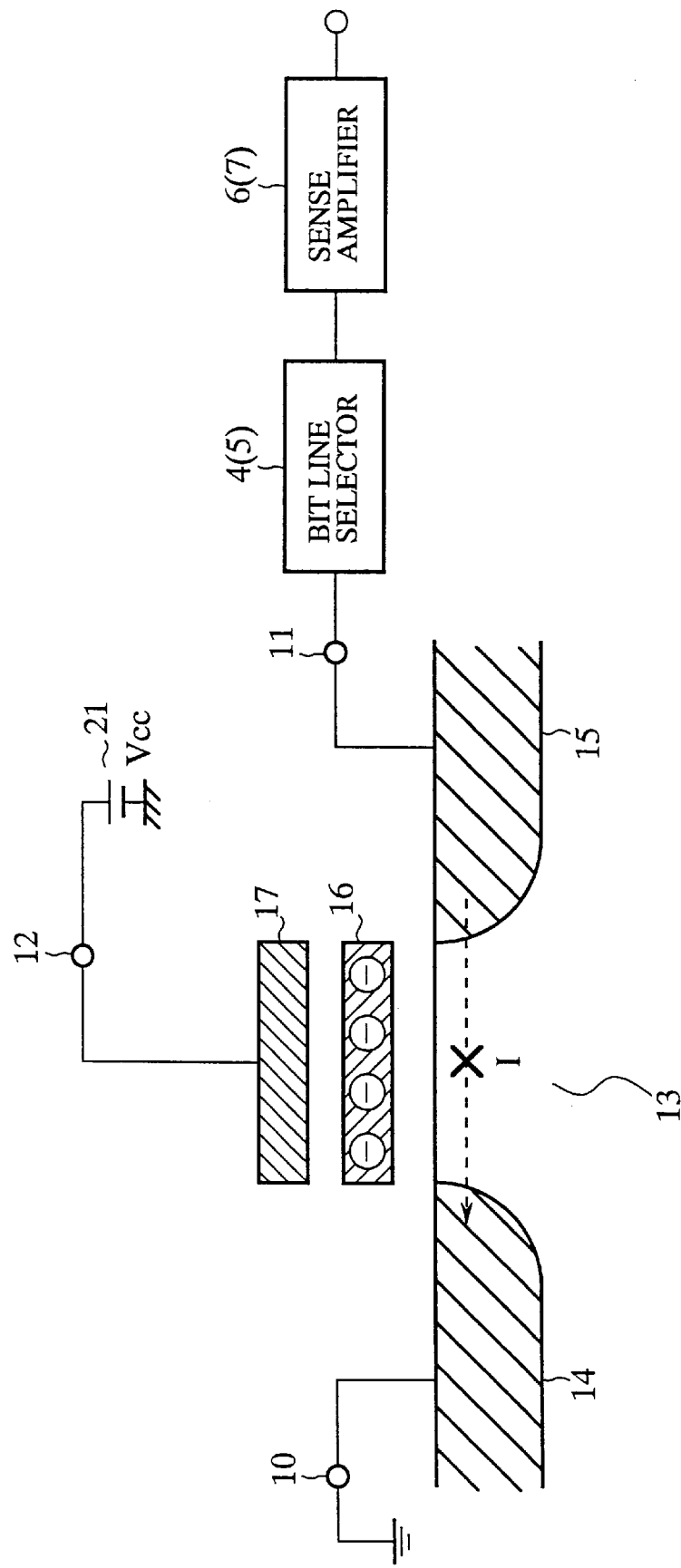
FIG. 8 is a block diagram showing a connection for reading data from a memory cell whose floating gate electrode stores the electric charge in the embodiment 1.

FIG. 8 is a block diagram showing a connection for reading the memory cell 2a (3a) when electric charge is stored in the floating gate electrode 16. In FIG. 8, connections between the individual components are the same as those of FIG. 7. With such a connection, a channel is not formed at the portion in the P-type semiconductor substrate 13 opposite to the floating gate electrode 16 in spite of the supply voltage to the gate electrode 17, thereby maintaining the non-conduction state between the source diffusion region 14 and drain diffusion region 15. Thus, even when the sense amplifier 6 (7) connects the read current source to the drain terminal 11 (bit line) to read data, no current flows from the drain terminal 11 to the source terminal 10, keeping the voltage level of the signal output from the drain terminal 11 at a high level. The sense amplifier 6 (7) compares the voltage level of the signal with the predetermined threshold voltage, and outputs data of "0" as shown in FIG. 3 because it is higher than the threshold voltage.

In the present embodiment 1, since the detecting threshold voltage of the detection sense amplifier 7 is set higher than the read threshold voltage of the read sense amplifier 6 as shown in FIG. 3, when the voltage levels gradually decrease of the signals output from the memory cells 2a and 3a, the detection data DD output from the detection sense amplifier 7 will change from "0" to "1" earlier than the read data RD does which is output from the read sense amplifier 6. In other words, as shown in FIG. 3, the voltage difference VP between the detection signal and the detection threshold level is set smaller than the voltage difference VR between the read signal level and the read threshold level. Thus, when writing data into the detection memory bank 3 and read memory bank 2 in the flash memory in accordance with the memory write operation as illustrated in the flowchart of FIG. 4, it is possible for the detection data DD to be inverted earlier than the read data RD is inverted owing to the time-varying reduction in the electric charge stored in the floating gate electrode 16.

According to the present embodiment 1, the detection memory cells 3a and detection sense amplifier 7 as well as the read memory cells 2a are formed on the same P-type semiconductor substrate 13, and the voltage difference VD between the threshold voltage of the detection sense amplifier 7 and the detection signal which is output from the detection memory cell 3a with the floating gate electrode 16 into which the electric charge is injected is set smaller than the voltage difference VR between the threshold voltage of the read sense amplifier 6 and the read signal which is output from the read memory cell 2a with the floating gate electrode 16 into which the electric charge is injected. This enables the erroneous inversion of the detection data DD to take place earlier than that of the read data RD owing to the time-varying reduction in the electric charge after its injection into the floating gate electrode 16. Accordingly, the detection of the data inversion of the detection signal makes it possible to predict the inversion of the read data RD. This enables the sign of the data inversion, that is, of the so-called threshold reduction in the memory transistors to be detected before it actually occurs. Thus, the update of the data or change of the memory can be implemented before the threshold reduction actually takes place in the memory transistors associated with the data read. Furthermore, since the threshold reduction in the memory transistors can be predictably detected using the memory cells 3a with the same characteristics as the memory cells 2a, the detection sense amplifier 7 can be formed on the P-type semiconductor substrate 13 without changing the memory cell area 1. This means that the present embodiment 1 can be implemented using the memory cell area 1 which is identical to that of the conventional flash memory.

Furthermore, the semiconductor memory of the present embodiment 1 can positively prevent the threshold reduction in the memory transistors as compared with the conventional semiconductor memories that do not have the function of detecting a sign of the threshold reduction in the memory transistors, and maintain a certain level of reliability by excluding, through their characteristic examinations, semiconductor memories which are likely to suffer from the threshold reduction in their memory transistors. Moreover, the yield of the semiconductor memories can be increased because it becomes possible to relax requirements for excluding semiconductor memories whose memory transistors could have undesirable characteristics to maintain their reliability in terms of their threshold reduction.

In addition, since a number of memory cells 3a are formed, their characteristics can be random. Thus, even if some memory cells 3a possess such characteristics that are unlikely to induce threshold reduction in the memory transistors, it is probable that other memory cells 3a have such characteristics that are more likely to cause it than the memory cells 2a. Therefore, detection of the data inversion in any one of the memory cells 3a makes it possible to detect the sign of the threshold reduction in the memory transistors independently of the effect of the variations in the process.

Finally, to select one of the detection memory cells 3a that supplies the detection signal to the detection sense amplifier 7, the word-line decoder 8 and the detection bit-line selector 5 with the same configuration as that of the read bit-line selectors 4 are used which are provided for selecting the read memory cells 2a. This enables different memory cells 3a to produce the detection data DD each time the data access takes place to the semiconductor memory. Accordingly, the threshold reduction in the memory transistors of individual memory cells 3a can be detected every time the data access occurs. This makes it possible to achieve early detection of the sign of the threshold reduction in the memory transistors, thereby ensuring its detection before it actually takes place in the memory cells 2a.

Embodiment 2

Figure 9:
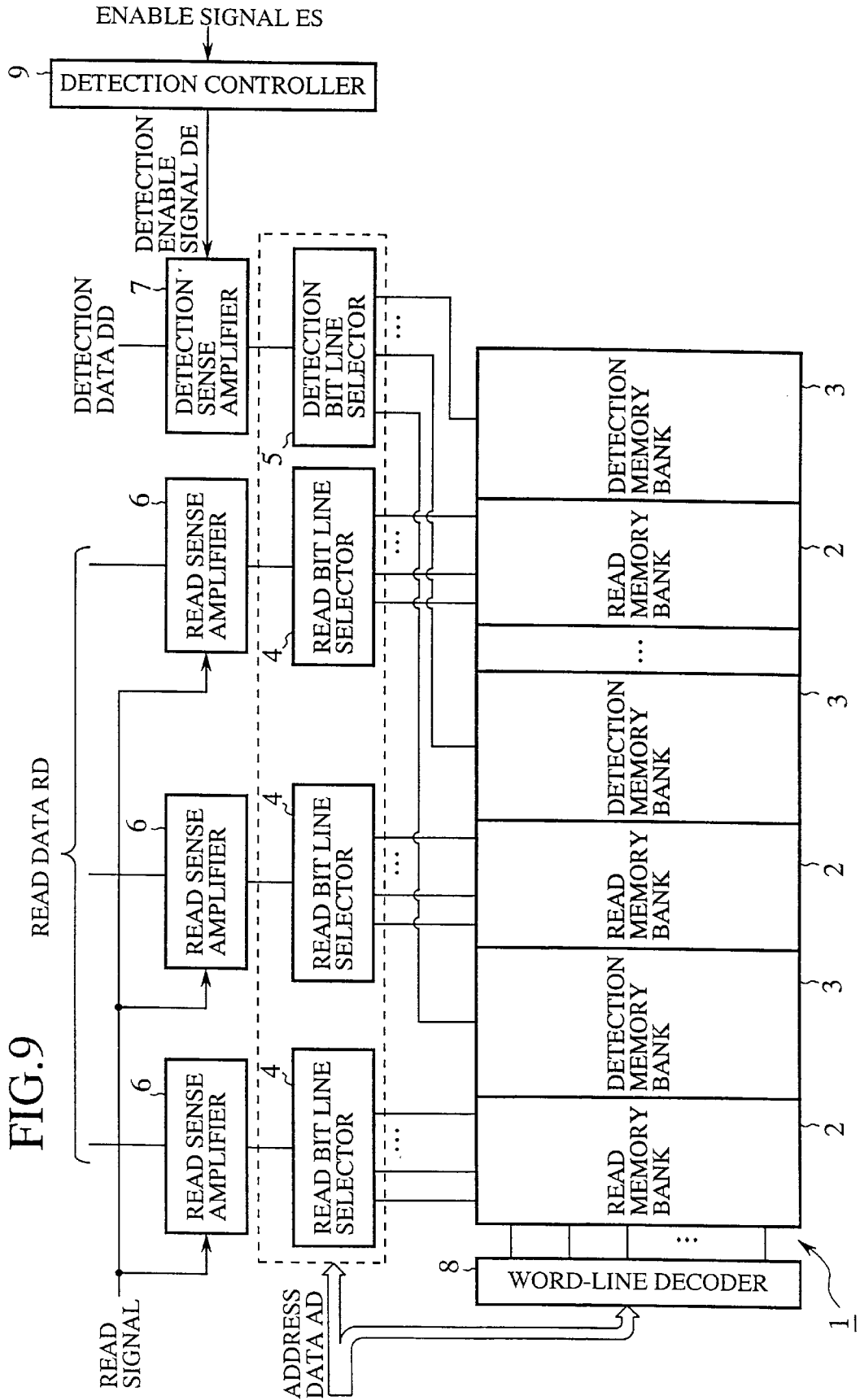
FIG. 9 is a block diagram showing a configuration of a major portion of an embodiment 2 of the flash memory in accordance with the present invention.

FIG. 9 is a block diagram showing a major portion of an embodiment 2 of the flash memory in accordance with the present invention. In FIG. 9, detection memory banks 3 are each adjacent to one of the read memory banks 2, and the entire bit lines connected to the detection memory banks 3 are connected to the input of the detection bit-line selector 5. Since the remaining configuration is the same as that of the embodiment 1, the description thereof is omitted here.

In addition, since the operation of the present embodiment 2 is analogous to that of the embodiment 1, the description thereof is also omitted.

According to the present embodiment 2, besides the effects in the embodiment 1, since the memory cells 3a are formed separately in the region of the memory cells 2a, their characteristics can be made random to about the same degree as those of the memory cells 2a. As a result, even if some memory cells 3a possess, owing to the process variations, such characteristics that are unlikely to cause threshold reduction in the memory transistors, other memory cells 3a can acquire such characteristics that are more likely to induce it than the memory cells 2a. Therefore, detection of the data inversion in any one of the memory cells 3a makes it possible to detect the sign of the threshold reduction in the memory transistors independently of the effect of the process variations.

Embodiment 3

Figure 10:
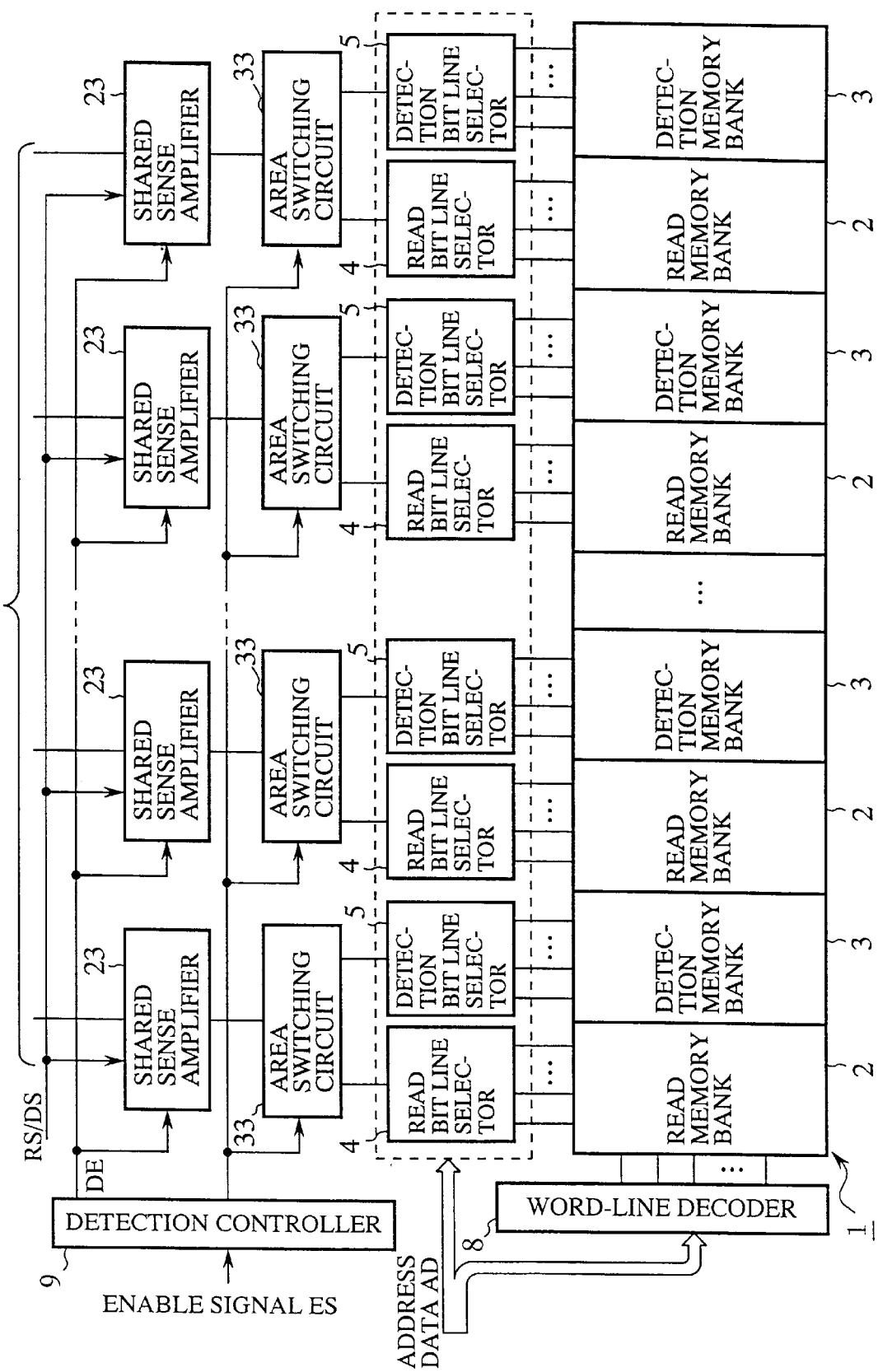
FIG. 10 is a block diagram showing a configuration of a major portion of an embodiment 3 of the flash memory in accordance with the present invention.

FIG. 10 is a block diagram showing a major portion of an embodiment 3 of the flash memory in accordance with the present invention. In FIG. 10, reference numerals 4s each designate the read bit-line selector identical to that of the embodiment 2, and 5s each designate the detection bit-line selector identical to that of the embodiment 2. Reference numerals 33s each designate an area switching circuit for selecting in response to the control signal fed from the detection controller 9 one of the two outputs from each pair of the read bit-line selector 4 and detection bit-line selector 5. The reference numerals 23s each designate a shared sense amplifier provided for each area switching circuit 33 for comparing the voltage level of the bit line selected by it with a predetermined threshold voltage, and for outputting one of the read data RD and detection data DD with the voltage level corresponding to the relationship between the compared voltages.

Figure 11:
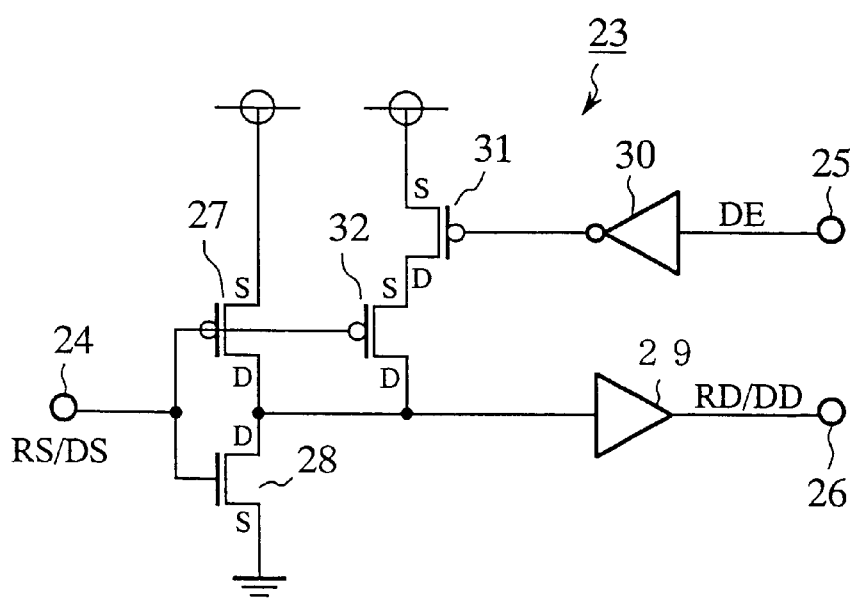
FIG. 11 is a circuit diagram showing a configuration of a threshold decision portion of a shared sense amplifier in the embodiment 3.

FIG. 11 is a circuit diagram showing the threshold decision portion of the shared sense amplifier 23. In FIG. 11, the reference numeral 24 designates a signal input terminal for receiving the read signal RS and detection signal DS; 25 designates an input terminal of a detection enable signal DE the detection controller 9 produces in response to the enable signal ES; 26 designates a data output terminal for outputting the read data RD and detection data DD; 27 designates a first P-type transistor having its source terminal connected to the supply voltage and its gate terminal connected to the signal input terminal 24; 28 designates a first N-type transistor having its drain terminal connected to the drain of the first P-type transistor 27, its gate terminal connected to the signal input terminal 24, and its source terminal grounded; 29 designates a tristate buffer inputting the potential at the connecting point of the drain terminals of the first P-type transistor 27 and first N-type transistor 28, and amplifying it to be output; 30 designates a control signal inverter for inverting the detection enable signal DE supplied to the input terminal 25, and for outputting it; 31 designates a second P-type transistor having its source terminal connected to the supply voltage and its gate terminal connected to the output of the control signal inverter 30; and 32 designates a third P-type transistor having its source terminal connected to the drain terminal of the second P-type transistor 31, its gate terminal connected to the signal input terminal 24 and its drain terminal connected to the input terminal of the tristate buffer 29.

Figure 12:
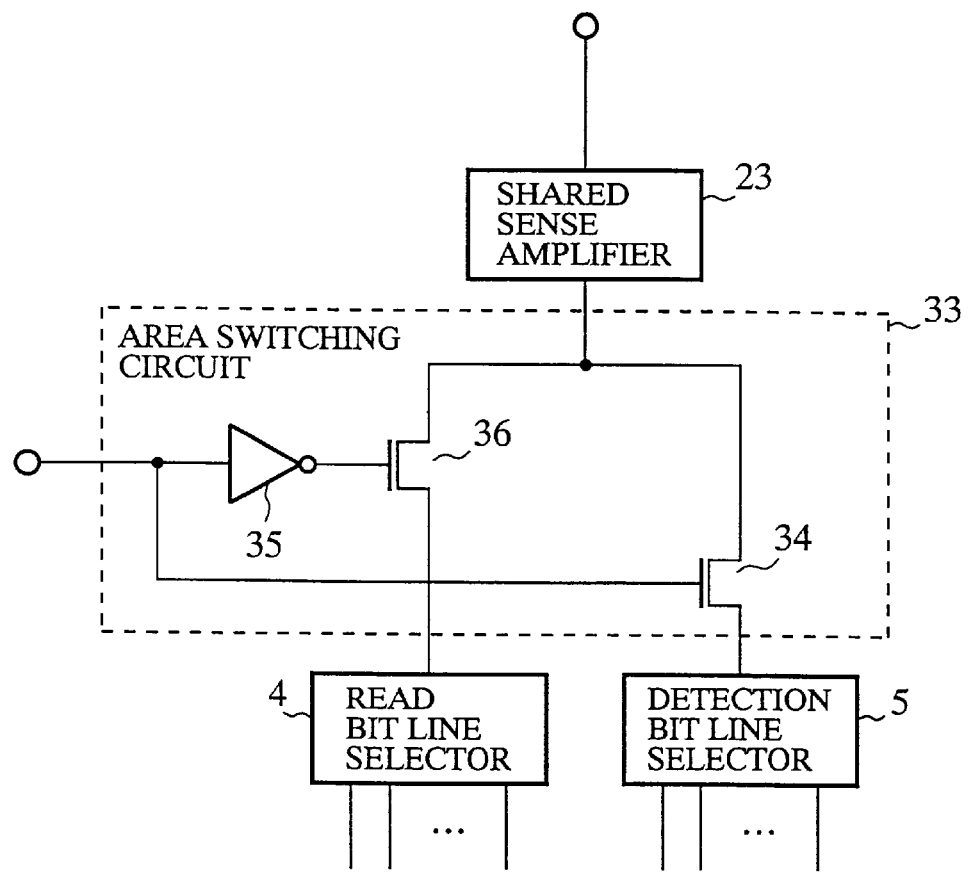
FIG. 12 is a circuit diagram showing an area switching circuit and its surrounding circuits in the embodiment 3.

FIG. 12 is a circuit diagram showing the configuration of the area switching circuit 33 and its surrounding circuits. In FIG. 12, the reference numeral 34 designates a first switching transistor connected between the output of the detection bit-line selector 5 and the input of the shared sense amplifier 23 for interconnecting them in response to the control signal fed from the detection controller 9; 35 designates a switching inverter for inverting the control signal from the detection controller 9; and 36 designates a second switching transistor for interconnecting the output of the read bit-line selector 4 with the input of the shared sense amplifier 23 in response to the inverted control signal output from the switching inverter 35. Since the remaining configuration is the same as that of the embodiment 2, the description thereof is omitted here.

Next, the operation of the present embodiment 3 will be described.

When read access takes place, the word-line decoder 8 selects the designated memory cells 2a in response to the second part of the address data AD, and the detection controller 9 supplies the shared sense amplifiers 23 and area switching circuits 33 with control signals. In response to this, the area switching circuit 33 has the read bit-line selector 4 select the bit lines to which the memory cells 2a are connected. At the same time, the detection enable signal DE of the low level is supplied to the shared sense amplifiers 23. This brings the second P-type transistor 31 out of conduction because its gate terminal is supplied with the high level voltage, and hence the input voltage to the tristate buffer 29 is determined by the input inverter consisting of the first P-type transistor 27 and first N-type transistor 28. Accordingly, when the read signal RS is at the high level due to the electric charge injected into the floating gate electrode 16 of the memory cell 2a, the read data RD is at the low level. On the contrary, when the read signal RS is at the low level without the electric charge injected to the floating gate electrode 16, the read data RD is at the high level. Thus, the area switching circuit 33 connects the output of the read bit-line selector 4 to the input of the shared sense amplifier 23.

Following the read operation, the detection controller 9 inverts the control signal to be supplied to the area switching circuits 33, so that the outputs of the detection bit-line selectors 5 are connected to the shared sense amplifiers 23, to detect the detection signals of the memory cells 3a. In this case, since the detection enable signal DE is set at the high level, the second P-type transistor 31 is brought into conduction, and the input voltage to the tristate buffer 29 is determined by the input inverter consisting of the first P-type transistor 27, third P-type transistor 32 and first N-type transistor 28. Thus using the two P-type transistors 27 and 32 connected in parallel as the pullup transistor of the input inverter enables its current amplification factor to be increases as compared with the case when only one P-type transistor 27 is used as the pullup transistor of the input inverter, thereby raising the threshold voltage of the input inverter. As a result, the voltage at which the detection data DD makes its transition from the low to high level is set higher than that of the read data RD. Since the remaining operation is analogous to that of the embodiment 2, the description thereof is omitted here.

Thus, according to the present embodiment 3, both the read signal and detection signal are input to the shared sense amplifiers 23. This makes it possible, besides the advantages of the embodiment 2, to achieve, with restricting the increase in the circuit scale, the data update or memory replacement before the threshold reduction actually takes place in the memory transistors associated with the read data RD. In addition, the yield of the semiconductor memories can be increased.

Embodiment 4

Figure 13:
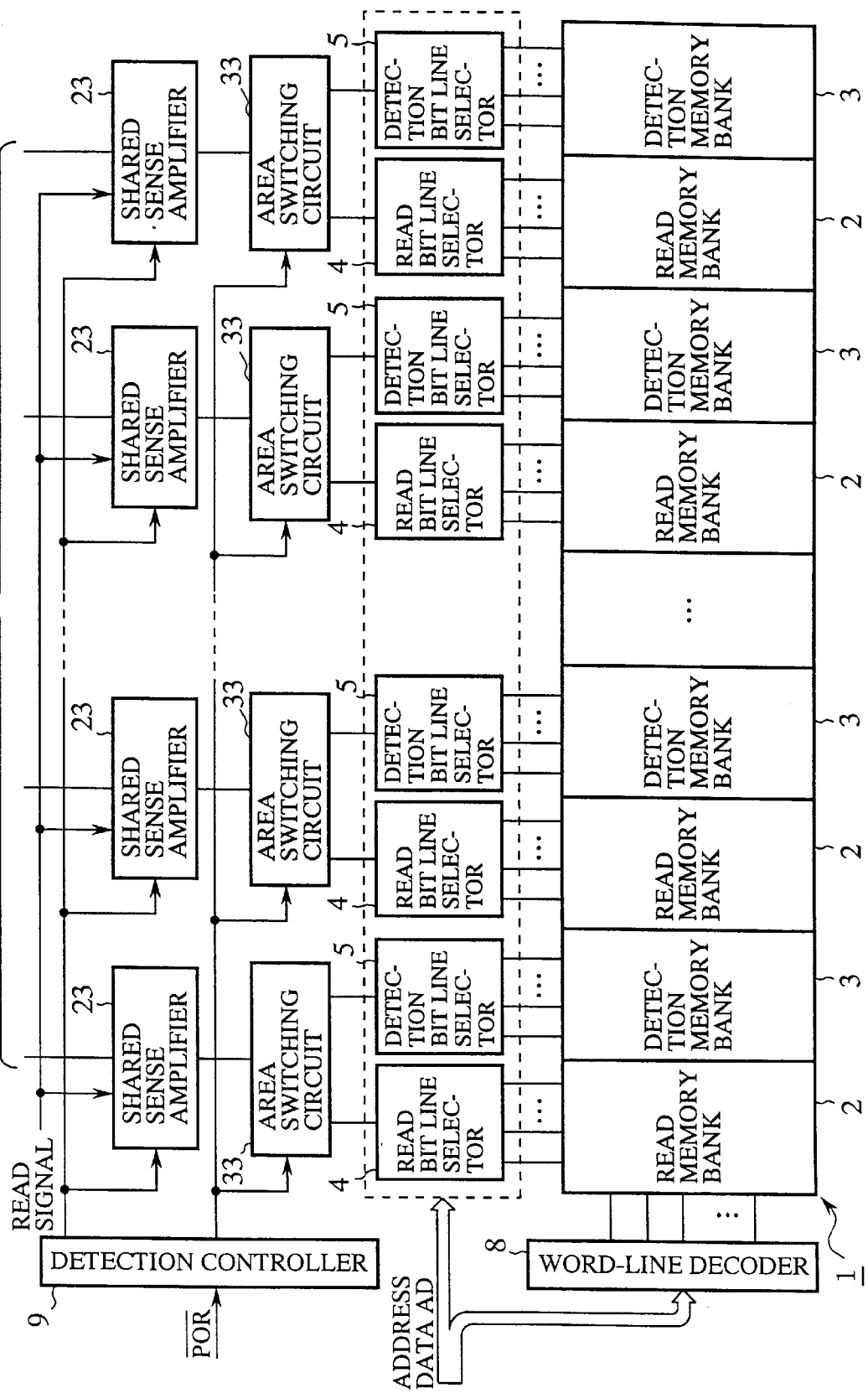
FIG. 13 is a block diagram showing a configuration of a major portion of an embodiment 4 of the flash memory in accordance with the present invention.

FIG. 13 is a block diagram showing a major portion of an embodiment 4 of the flash memory in accordance with the present invention. In FIG. 13, the reference numeral 9 designates the detection controller to which a power on reset signal is input from the outside of the flash memory when the power is turned on. Since the remaining configuration is the same as that of the embodiment 3, the description thereof is omitted here.

Next, the operation of the embodiment 4 will be described.

When an electric circuit on which the flash memory is mounted is turned on, an initialize circuit not shown in this figure outputs the power on reset signal POR. In response to it, the detection controller 9 supplies the control signals to shared sense amplifiers 23 and area switching circuits 33 in order to produce the detection data DD. Afterward, when the read access takes place, the detection controller 9 supplies the control signals to the shared sense amplifiers 23 and area switching circuits 33 in order to produce the read data RD.

Since the remaining operation is analogous to that of the embodiment 3, the description thereof is omitted here.

According to the present embodiment 4, the sign of the threshold reduction in the memory transistors can be detected each time the system such as a common personal computer is turned on every day. Since the threshold reduction basically takes place in a span of years such as one year or five years, the present embodiment can maintain sufficient performance of detecting the threshold reduction in the memory transistors in the common personal computers and the like. In addition, it can reduce the consumed power and increase the processing speed as compared when the detection data DD is output each time the data access takes place.

Embodiment 5

Figure 14:
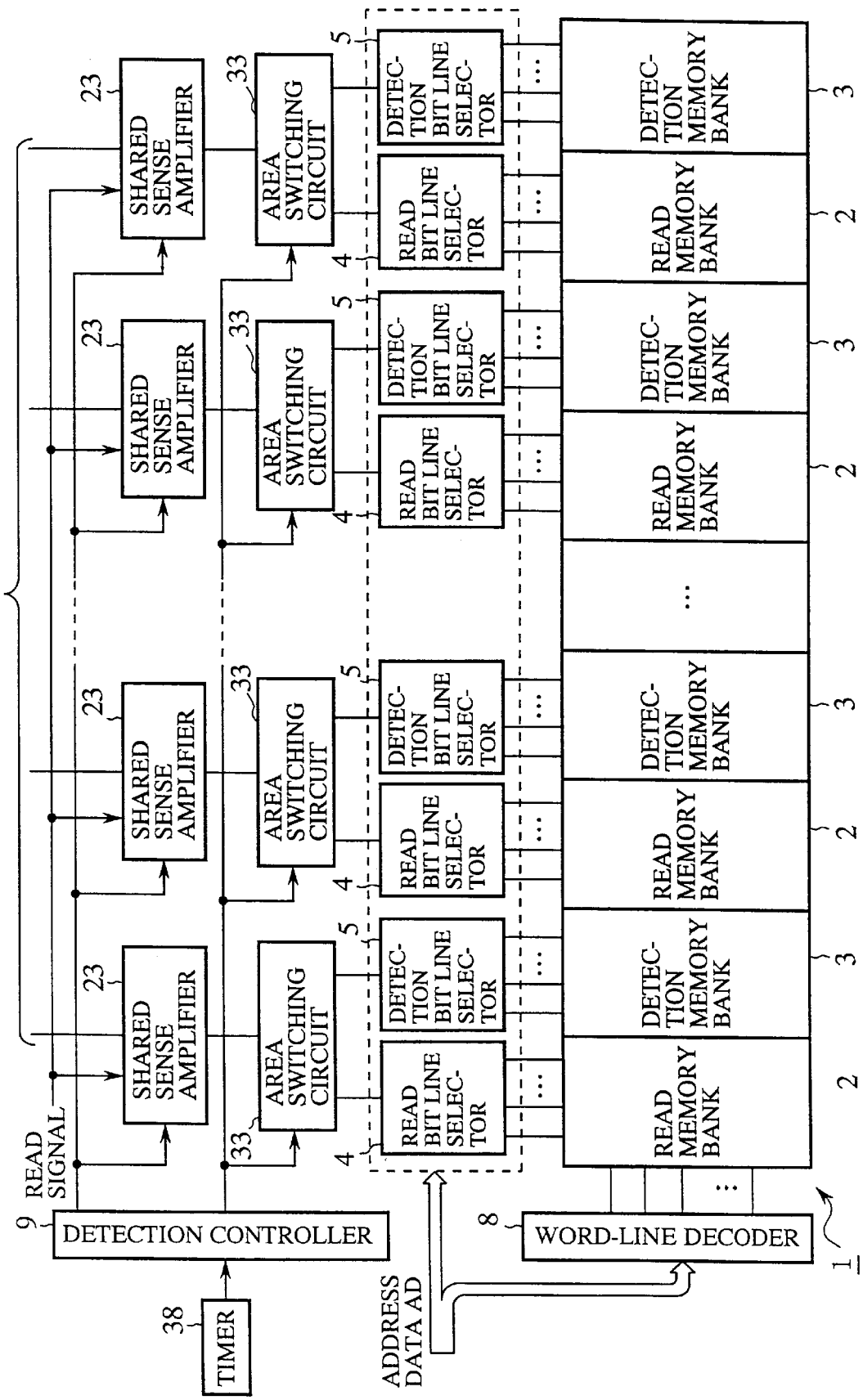
FIG. 14 is a block diagram showing a configuration of a major portion of an embodiment 5 of the flash memory in accordance with the present invention.

FIG. 14 is a block diagram showing a major portion of an embodiment 5 of the flash memory in accordance with the present invention. In FIG. 14, the reference numeral 38 designates a timer that continues to count a duration from the time the power is turned on, and outputs an overflow signal at every predetermined time interval, like several days and months. The timer supplies the detection controller 9 with the overflow signal instead of the power on reset signal of the embodiment 4. Since the remaining configuration is the same as that of the embodiment 4, the description thereof is omitted here.

Next, the operation of the present embodiment 5 will be described.

After the predetermined time interval has elapsed since the power has been turned on in an electric circuit on which the flash memory is mounted, the timer 38 outputs the overflow signal. In response to it, the detection controller 9 supplies the control signals to the shared sense amplifiers 23 and area switching circuits 33 in order to produce the detection data DD. Afterward, when the read access takes place, the detection controller 9 supplies the control signals to the shared sense amplifiers 23 and area switching circuits 33 in order to produce the read data RD. Since the remaining operation is the same as that of the embodiment 4, the description thereof is omitted here.

According to the present embodiment 5, the sign of the threshold reduction in the memory transistors can be detected at every predetermined interval in the system such as an office computer, typically a server, which is used with its power on for several months and years. Since the threshold reduction basically takes place in a span of years such as one year or five years, the present embodiment can maintain sufficient performance of detecting the threshold reduction in the memory transistors in the office computers like the server. In addition, it can reduce the consumed power and increase the processing speed as compared with the case where the detection data DD is output each time the data access takes place.

Embodiment 6

FIGS. 15A and 15B are cross-sectional views of the memory cells 3a and 2a, respectively, of an embodiment 6 of the flash memory in accordance with the present invention. In FIG. 15A, the symbol ds designates the distance between the floating gate electrode 16 and P-type semiconductor substrate 13 in the memory cell 3a, and in FIG. 15B, dr designates the distance between the floating gate electrode 16 and P-type semiconductor substrate 13 in the memory cell 2a, where ds<dr. Since the remaining structure is the same as that of the embodiment 2, the description thereof is omitted here.

The structure has such a characteristic that it is easier for the electric charge to leak from the floating gate electrode 16 of the memory cell 3a than from that of the memory 2a. Accordingly, the threshold reduction in the memory transistor is likely to occur earlier in the memory cell 3a than in the memory cell 2a owing to the leakage of the electrons injected into the floating gate electrode 16.

According to the present embodiment 6, the threshold reduction is likely to take place earlier in the memory cells 3a than in the memory cells 2a. This enables the sign of the threshold reduction in the memory transistors in the memory cells 2a to be positively detected on the basis of the detection signal obtained from the memory cells 3a. In addition, considering the variations in the semiconductor memory process in fabricating the memory cells 2a and 3a, the present embodiment 6, which makes their characteristics different, can detect the sign of the threshold reduction in the memory transistors of the memory cells 2a more positively than when their characteristics are made uniform. In particular, since the memory cells 3a are separately formed in the region of the memory cells 2a, the reliability of detecting the sign of the threshold reduction in the memory transistors are much improved.

Although the present embodiment 6 is described in connection with the embodiment 2, it can be combined with any other embodiments, offering the same advantages.

Embodiment 7

Figure 16B:
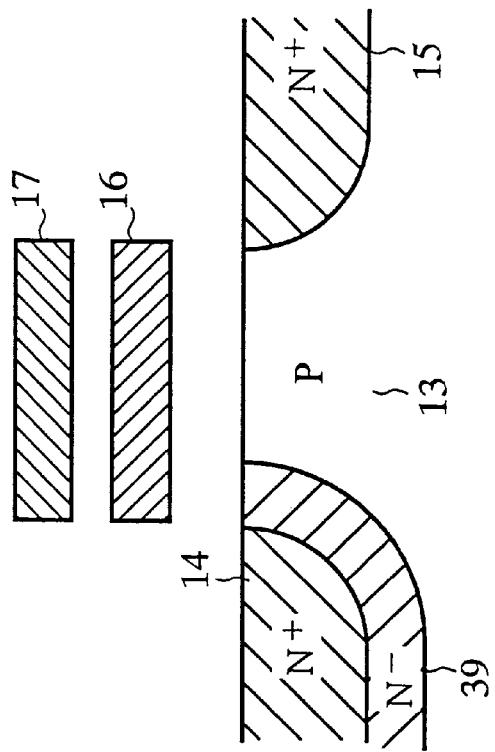
FIGS. 16A and 16B are cross-sectional views showing a detection memory cell 3a and a read memory cell 2a of an embodiment 7 of the flash memory in accordance with the present invention, respectively.
Figure 16A:
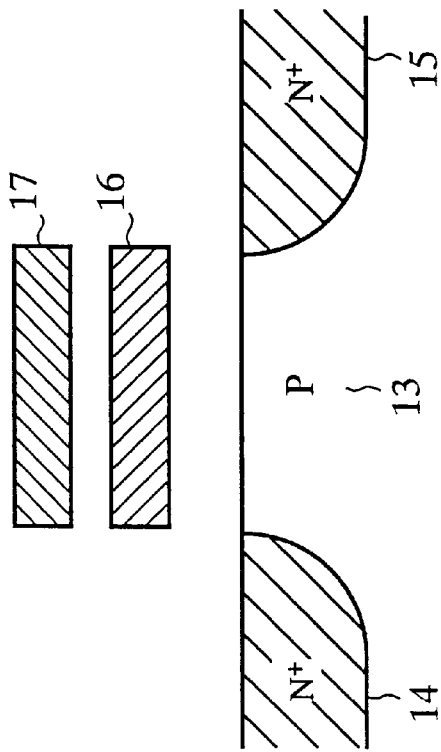
Figure 18:
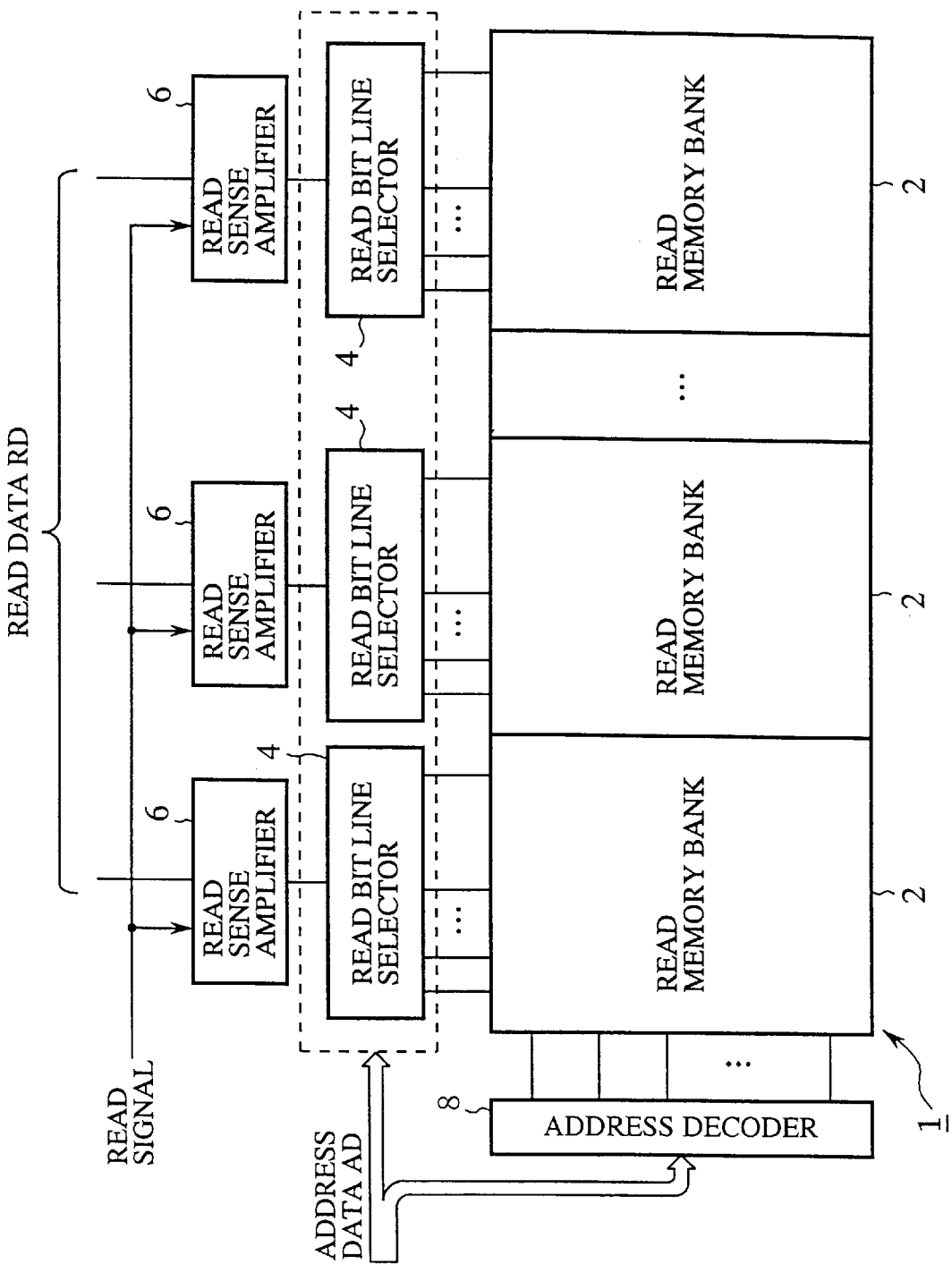
FIG. 18 is a block diagram showing a configuration of a major portion of a conventional flash memory.
Figure 19:
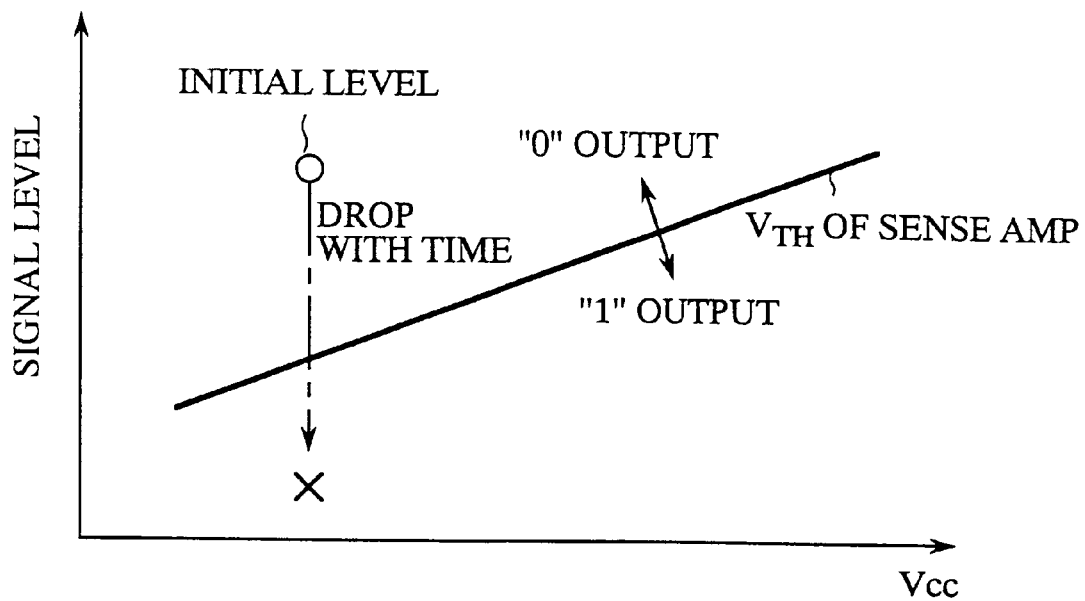
FIG. 19 is a graph illustrating threshold voltage characteristics of a conventional sense amplifier.

FIGS. 16A and 16B are cross-sectional views of the memory cells 2a and 3a of an embodiment 7 of the flash memory in accordance with the present invention, respectively. In FIG. 16B the reference numeral 39 designates a (lightly doped) N-source diffusion region formed on the periphery of the N-type source diffusion region 14 of the memory cell 2a. Since the remaining structure is the same as that of the embodiment 2, the description thereof is omitted here.

With the N-source diffusion region 39 formed only in the memory cell 2a, a characteristic is obtained that it is easier for the electric charge to leak from the floating gate electrode 16 of the memory cell 3a than from that of the memory 2a. Accordingly, the threshold reduction in the memory transistor is likely to occur earlier in the memory cell 3a than in the memory cell 2a owing to the leakage of the electrons injected into the floating gate electrode 16.

According to the present embodiment 7, the threshold reduction is likely to take place earlier in the memory cells 3a than in the memory cells 2a. This offers an advantage similar to that of the embodiment 6. Although the present embodiment 7 is described in connection with the embodiment 2, it can be combined with any other embodiments, offering the same advantages.

Embodiment 8

Figure 17:
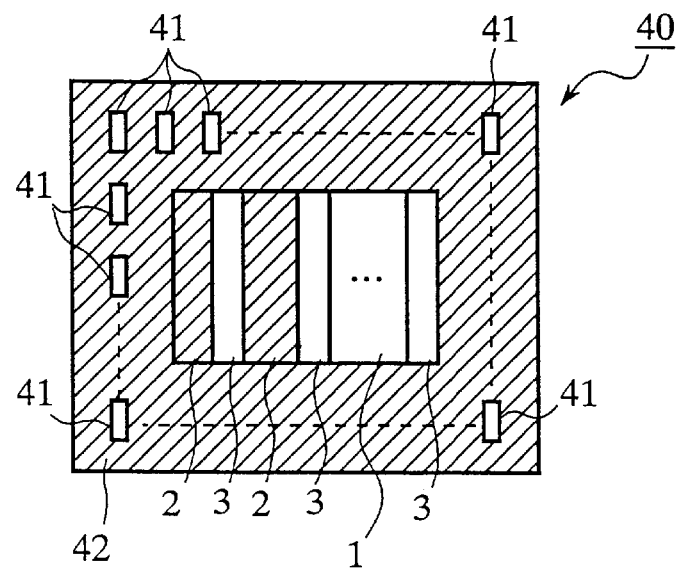
FIG. 17 is a top view of an embodiment 8 of a flash memory chip in accordance with the present invention.

FIG. 17 is a plan view of an embodiment 8 of a flash memory chip in accordance with the present invention. In FIG. 17, the reference numeral 40 designates a flash memory chip; reference numerals 41s each designate a pad to which a bonding wire is connected; and 42 designates a polyimide coated area which is formed on the portion excluding the pads 41 and the surface of the detection memory banks 3 on the flash memory chip 40. Since the remaining portion is the same as that of the embodiment 2, the description thereof is omitted here.

With the polyimide coating laminated on the read memory banks 2 in the memory cell area 1, a characteristic is obtained that it is easier for the electric charge to leak from the floating gate electrodes 16 of the memory cells 3a than from those of the memory cells 2a. Accordingly, the threshold reduction in the memory transistor is likely to occur earlier in the memory cells 3a than in the memory cells 2a owing to the leakage of the electrons injected into the floating gate electrode 16.

According to the present embodiment 8, the threshold reduction is likely to take place earlier in the memory cells 3a than in the memory cells 2a. This offers an advantage similar to that of the embodiment 6. Although the present embodiment 8 is described in connection with the embodiment 2, it can be combined with any other embodiments, offering the same advantages.

What is claimed is:

1. A semiconductor memory comprising:
 a plurality of read memory cells, each of which includes a floating gate electrode and outputs a read signal with a voltage level corresponding to an amount of electric charge injected into its floating gate electrode;
 one or more detection memory cells formed on a semiconductor substrate on which said read memory cells are formed, each of said detection memory cells having a floating gate electrode and outputting a detection signal with a voltage level corresponding to an amount of electric charge injected into its floating gate electrode;
 one or more read sense amplifiers, each of which makes a decision of the voltage level of the read signal by comparing it with a first threshold voltage, and outputs the results as read data; and
 one or more detection sense amplifiers, each of which makes a decision of the voltage level of the detection signal by comparing it with a second threshold voltage, and outputs the result as detection data,
 wherein at least one of a group of said detection memory cells and a group of said detection sense amplifiers is formed to induce erroneous data inversion of said detection data earlier than that of said read data in a time-varying process of the electric charge in said floating gate electrodes, and
 wherein said detection memory cells are formed to leak the electric charge in their floating gate electrodes more easily than said read memory cells.

2. The semiconductor memory as claimed in claim 1, wherein said detection memory cells are disposed separately in a memory cell area from said read memory cells.

3. The semiconductor memory as claimed in claim 1, wherein said first threshold voltage and said second threshold voltage are set such that a voltage difference between the second threshold voltage and the voltage level of the detection signal is smaller than a voltage difference between the first threshold voltage and the voltage level of the read signal.

4. The semiconductor memory as claimed in claim 1, wherein a distance between the semiconductor substrate and the floating gate electrodes in said detection memory cells is shorter than that in said read memory cells.

5. The semiconductor memory as claimed in claim 1, wherein each of said read memory cells comprises an N-type source diffusion region, and a lightly doped N-type source diffusion region formed on a periphery of said N-type source diffusion region.

6. The semiconductor memory as claimed in claim 1, wherein said read memory cells have a coating formed thereon.

7. The semiconductor memory as claimed in claim 1, further comprising a control circuit for enabling said detection sense amplifiers to output the detection data of said detection memory cells when data access takes place in said semiconductor memory.

8. The semiconductor memory as claimed in claim 1, further comprising a control circuit for enabling said detection sense amplifiers to output the detection data of said detection memory cells when power is turned on to said semiconductor memory.

9. A semiconductor memory comprising:
 a plurality of read memory cells each of which includes a floating gate electrode and outputs a read signal with a voltage level corresponding to an amount of electric charge injected into its floating gate electrode;
 one or more detection memory cells formed on a semiconductor substrate on which said read memory cells are formed each of said detection memory cells having a floating gate electrode and outputting a detection signal with a voltage level corresponding to an amount of electric charge injected into its floating gate electrode;
 one or more read sense amplifiers each of which makes a decision of the voltage level of the read signal by comparing it with a first threshold voltage, and outputs the results as read data;
 one or more detection sense amplifiers each of which makes a decision of the voltage level of the detection signal by comparing it with a second threshold voltage, and outputs the result as detection data; and
 a control circuit enabling said detection sense amplifiers to output the detection data of said detection memory cells at every fixed interval,
 wherein at least one of a group of said detection memory cells and a group of said detection sense amplifiers is formed to induce erroneous data inversion of said detection data earlier than that of said read data in a time-varying process of the electric charge in said floating gate electrodes.

10. A semiconductor memory comprising:
 a plurality of read memory cells, each of which includes a floating gate electrode and outputs a read signal with a voltage level corresponding to an amount of electric charge injected into its floating gate electrode;
 one or more detection memory cells formed on a semiconductor substrate on which said read memory cells are formed, each of said detection memory cells having a floating gate electrode and outputting a detection signal with a voltage level corresponding to an amount of electric charge injected into its floating gate electrode; and
 one or more shared sense amplifiers, each of which makes a decision of the voltage level of the read signal by comparing it with a first threshold voltage to output the result as read data, and makes a decision of the voltage level of the detection signal by comparing it with a second threshold voltage to output the result as detection data,
 wherein at least one of a group of said detection memory cells and a group of said shared sense amplifiers is formed to induce erroneous data inversion of said detection data earlier than that of said read data in a time-varying process of the electric charge in said floating gate electrodes.

11. The semiconductor memory as claimed in claim 10, wherein said detection memory cells are disposed separately in a memory cell area from said read memory cells.

12. The semiconductor memory as claimed in claim 10, wherein said first threshold voltage and said second threshold voltage are set such that a voltage difference between the second threshold voltage and the voltage level of the detection signal is smaller than a voltage difference between the first threshold voltage and the voltage level of the read signal.

13. The semiconductor memory as claimed in claim 10, wherein said detection memory cells are formed to leak the electric charge in their floating gate electrodes more easily than said read memory cells.

14. The semiconductor memory as claimed in claim 13, wherein a distance between the semiconductor substrate and the floating gate electrodes in said detection memory cells is shorter than that in said read memory cells.

15. The semiconductor memory as claimed in claim 13, wherein each of said read memory cells comprises an N-type source diffusion region, and a lightly doped N-type source diffusion region formed on a periphery of said N-type source diffusion region.

16. The semiconductor memory as claimed in claim 13, wherein said read memory cells have a coating formed thereon.

17. The semiconductor memory as claimed in claim 10, further comprising a control circuit for enabling said shared sense amplifiers to output the detection data of said detection memory cells when data access takes place in said semiconductor memory.

18. The semiconductor memory as claimed in claim 10, further comprising a control circuit for enabling said shared sense amplifiers to output the detection data of said detection memory cells when power is turned on to said semiconductor memory.

19. The semiconductor memory as claimed in claim 10, further comprising a control circuit for enabling said shared sense amplifiers to output the detection data of said detection memory cells at every fixed interval.

* * * * *